US007057116B2

(12) United States Patent
Reid et al.

(10) Patent No.: US 7,057,116 B2
(45) Date of Patent: Jun. 6, 2006

(54) SELECTIVE REFERENCE PLANE BRIDGE(S) ON FOLDED PACKAGE

(75) Inventors: Geoffery L. Reid, Mesa, AZ (US); Edward W. Jaeck, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 247 days.

(21) Appl. No.: 10/452,873

(22) Filed: Jun. 2, 2003

(65) Prior Publication Data

US 2004/0238206 A1    Dec. 2, 2004

(51) Int. Cl.
H05K 1/16    (2006.01)
(52) U.S. Cl. .................. 174/260; 174/254; 174/253
(58) Field of Classification Search ............. 174/253, 174/254, 260
See application file for complete search history.

(56) References Cited

U.S. PATENT DOCUMENTS

| | | | |
|---|---|---|---|
| 5,652,608 | A | 7/1997 | Watanabe et al. |
| 5,777,265 | A | 7/1998 | Bhattacharyya et al. |
| 5,793,101 | A | 8/1998 | Kuhn |
| 5,936,848 | A | 8/1999 | Mehr et al. |
| 6,208,521 | B1 | 3/2001 | Nakatsuka |
| 6,225,688 | B1 | 5/2001 | Kim et al. |
| 6,350,633 | B1 | 2/2002 | Lin |
| 6,365,962 | B1 | 4/2002 | Liang et al. |
| 6,436,318 | B1 | 8/2002 | McFarland et al. |
| 6,444,921 | B1 * | 9/2002 | Wang et al. .......... 174/260 |
| 6,448,108 | B1 | 9/2002 | Lin |
| 6,462,412 | B1 | 10/2002 | Kamei et al. |
| 6,489,557 | B1 | 12/2002 | Eskildsen et al. |

(Continued)

FOREIGN PATENT DOCUMENTS

EP    0521735    1/1993

(Continued)

OTHER PUBLICATIONS

Al-Sarawi, S.F., et al., "A review of 3-D packaging technology," IEEE Transactions on Components, Packaging, and Manufacturing Technology, Part B, vol. 21, No. 1, Feb. 1998, pp. 2-13.

(Continued)

Primary Examiner—Kamand Cuneo
Assistant Examiner—Yuriy Semenenko
(74) Attorney, Agent, or Firm—Blakely, Sokoloff, Taylor & Zafman LLP

(57) ABSTRACT

An apparatus including a substrate having dimensions suitable as a support circuit for at least one integrated circuit, the substrate comprising a laterally extending plication region defining first and second longitudinal portions; a plurality of conductive traces distributed in a first distribution plane of the substrate and extending transversely through the plication region; a first and second layers of conductive material in a second distribution plane of the first portion and second portion, respectively, of the substrate; at least one conductive bridge extending transversely through less than the entire plication region in the second distribution plane and coupled to the first continuous layer and to the second continuous layer; and at least one externally accessible contact point coupled to at least one of the first and second layers. A method of forming a support circuit and a system including a package.

15 Claims, 4 Drawing Sheets

U.S. PATENT DOCUMENTS

| | | |
|---|---|---|
| 6,489,678 B1 | 12/2002 | Joshi |
| 6,521,485 B1 | 2/2003 | Su et al. |
| 6,532,162 B1 | 3/2003 | Schoenborn |
| 6,544,813 B1 | 4/2003 | Lin |
| 2002/0065965 A1 | 5/2002 | Sathe et al. |
| 2002/0172026 A1 | 11/2002 | Chong et al. |
| 2003/0001287 A1 | 1/2003 | Sathe |

FOREIGN PATENT DOCUMENTS

| | | |
|---|---|---|
| EP | 1041633 | 10/2000 |
| EP | 1041633 A1 * | 10/2000 |
| FR | 2754416 | 4/1998 |
| JP | 2260598 | 10/1990 |

OTHER PUBLICATIONS

Engelmaier, W., "Improving the design for flexibility of flex circuits," International Electronic Packaging and Production Conferences, Oct. 1974, Proceedings of the Internepcon and International Microelectronics, Oct. 1974, pp. 12-19.

"Processes for manufacturing multilayer tab," Research Disclosure, Kenneth Mason Publications, Hampshire, GB, No. 373, May 1995, pp. 303-307.

Notification of Transmittal of the International Search Report and the Written Opinion of the International Searching Authority, or the Declaration, Dec. 12, 2004.

* cited by examiner

SELECTIVE REFERENCE PLANE BRIDGE(S) ON FOLDED PACKAGE

BACKGROUND

1. Field

Circuit packaging.

2. Background

Circuit dies or chips are commonly provided as individual, pre-packaged units. A typical chip has a flat, rectangular body with a front face having contacts for connection to internal circuitry of the chip. An individual chip is typically mounted to a substrate or chip carrier (substrate package or support circuit), that in turn is mounted on a circuit panel such as a printed circuit board.

Multichip modules have been developed in which typically, several chips possibly having related functions are attached to a common circuit panel and protected by a common package. One advantage to this approach is a conservation of space that might ordinarily be wasted by individual chip packages. However, most multichip module designs utilize a single layer of chips positioned side-by-side on a surface of a planar circuit panel. In "flip chip" designs, a face of the chip confronts a face of a circuit panel and contacts on the chip are bonded to the circuit panel by solder balls or other connecting elements. The flip chip design provides a relatively compact arrangement where each chip occupies an area of the circuit panel equal to or slightly larger than the area of the chip face.

In addition to the above packaging technologies, laminate-type packaging systems have been proposed. In the laminate-type packaging system, chips are mounted on film carriers and the film carriers are laminated on a substrate and connected. For example, a chip may be mounted on a generally flexible tape and the tape is laminated to a circuit panel. Flexible substrate packages such as described above typically have a single metal layer to provide signals to and/or from the chip to the panel. The single metal layer routes to contact structures on the surface of the substrate suitable for connecting to the panel.

Flexible substrates that may contain multiple chips have also been proposed. In this configuration, a chip is mounted to a first portion of a flexible substrate (e.g., tape) and one or more additional chips are mounted at other portion(s) of the flexible substrate. The flexible substrate may then be folded so that the chips mounted to the flexible substrate may be aligned in a superposed or stacked arrangement.

Performance evaluations of a package (e.g., chip and substrate) are used to characterize and classify the capability (e.g., frequency capabilities) of the package. As signal frequency is increased, the contribution of the substrate plays a larger role. For example, critical input/output (I/O) and clock/strobe traces need controlled trace impedance for signal integrity. One way to control trace impedance is to use a ground plane on the substrate. Typically, a ground plane is a blanket layer of a metal material across a face of a substrate. With a foldable substrate, a blanket ground plane can affect foldability.

BRIEF DESCRIPTION OF THE DRAWINGS

Features, aspects, and advantages of embodiments of the invention will become more thoroughly apparent from the following detailed description, appended claims, and accompanying drawings in which:

DETAILED DESCRIPTION

Figure 1:
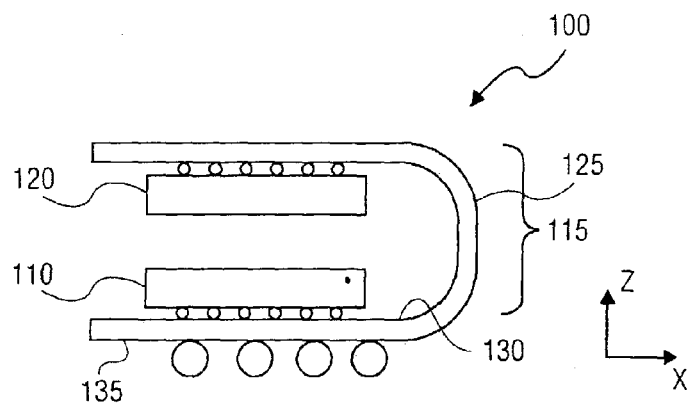
FIG. 1 shows a schematic side view of a foldable package having two chips.

FIG. 1 shows a schematic side view of a package including a support circuit or package substrate and two chips mounted thereon. In one embodiment, package 100 includes flexible substrate 125 having chip 110 and chip 120 mounted thereon. Chip 110 and chip 120, in this example, are mounted to a similar side of substrate 125. FIG. 1 shows package 100 in a folded configuration (represented as an inverted "C"). It is appreciated that package 100 may include substrate 125 having areas suitable for mounting additional chips in a superposed (stacked) configuration, for example, through additional folds in substrate 125 (e.g., an "S" shape for three substrates, etc.). Configurations other than superposed may also be utilized where desired. One advantage to the superposed configuration shown is that the XY area occupied by package 100 may be reduced through the utilization of Z dimension space.

Substrate 125, in one embodiment, is a flexible substrate. Suitable material for a flexible substrate includes a polyimide material, such as a KAPTON™ polyimide material having a thickness on the order of 25 to 50 microns. First side 130 of substrate 125 includes areas, in this example, for supporting chip 110 and chip 120 and electrically connecting the chips to substrate 125. Representatively, substrate 125 includes areas having grid arrays to support flip-chip bonding of chip 110 and chip 120 to substrate 125 (e.g., through solder contacts). In such instance, chip 110 and chip 120 include contact pads across a face connected to circuitry in the chip. Alternatively, chip 110 and chip 120 may have contacts located along one or more edges of a face to allow wire bonding of the chips to substrate 125.

FIG. 1 shows substrate 125 in folded state to form an inverted "C" as illustrated with the areas supporting a chip superposed. Substrate 125 includes plication region 115 that accepts the fold or bend of the substrate. Plication portion 115, in one sense, demarcates substrate 125 into two portions.

Figure 2:
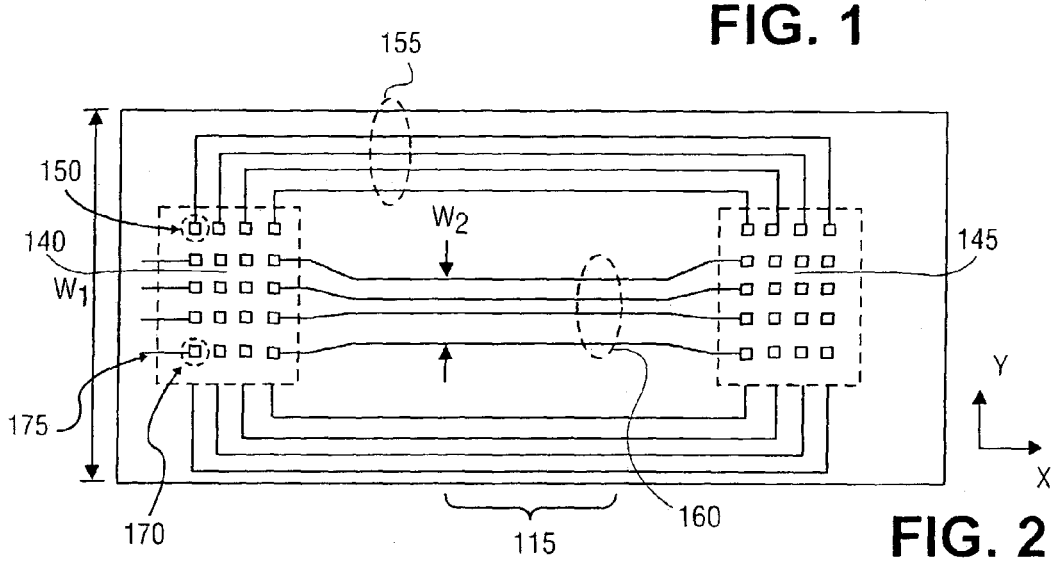
FIG. 2 shows a schematic top view of the package substrate of FIG. 1 in an unfolded state.

FIG. 2 shows a schematic top view of flexible substrate 125 shown in FIG. 1. Flexible substrate 125, in this figure, is in an unfolded or generally planar configuration. In this embodiment, surface 130 of substrate 125 includes a number of attachment sites to which chips may be attached to substrate 125. Representatively, FIG. 2 shows first attachment site 140 and second attachment site 145 to accommodate chip 110 and chip 120, respectively. First attachment site 140 and second attachment site 145 are shown as visible rectangular areas in FIG. 2 for clarity of illustration. In actual practice, first attachment site 140 and second attachment site 145 need not have visible borders.

Referring to FIG. 2, first attachment site 140 and second attachment site 145 include contact points 150 therein. Contact points 150 may correspond to respective ones of contact points on chip 110 or chip 120 for electrical connection of the respective chip to substrate 125. In one embodiment, traces 155 and traces 160 extend from respective ones of contact points 150 between first attachment site 140 and second attachment site 145. As illustrated, traces 155 and traces 160 may provide electrical communication between chip 110 and chip 120 electrically connected at first attachment site 140 and second attachment site 145, respectively. Additional contact points 170 and traces 175 shown, in this example, at first attachment site 140 may be used to electrically connect package 100 to a panel, such as the printed circuit board. Representatively, contact points 170 may be used for connecting power, ground, and/or signaling circuitry between package 100 and a panel (e.g., printed circuit board). Traces 175 may connect to conductive contact points on surface 135 of substrate 125 (opposite surface 130). In this embodiment, contact points 170 and traces 175 are shown as a portion of the number of contact points and traces on substrate 125. For example, multiple traces could be bussed together or serve as common power/ground lines to each chip. In other embodiments, all traces run to individual contact points on surface 135 of substrate 125.

FIG. 2 shows substrate 125 in an unfolded or generally planar (XY) configuration. In one embodiment, plication region 115 is disposed between first attachment site 140 and second attachment site 145. Traces 155 and traces 160 extend longitudinally across substrate 125 and transversely through plication region 115.

In the embodiment illustrated in FIG. 2, traces 155 and traces 160 are separated. Traces 155 extend as a group, in this illustration, longitudinally along the periphery of package 125. Traces 160, on the other hand, extend longitudinally through a central or middle area of substrate 125 as viewed. In one embodiment, traces 160 correspond to traces that transmit signals that are more susceptible to impedance variations than the signals transmitted by traces 155 for a particular application. Representatively, critical input/output (I/O) and clock/strobe traces and other high speed frequency signals (e.g., greater than 50 megahertz (MHz)) may be grouped, in this one example, as traces 160 through a central portion of substrate 125. FIG. 2 shows a collective lateral width, $W_2$, of traces 160 is less than a lateral width, $W_1$, of substrate 125.

Figure 3:
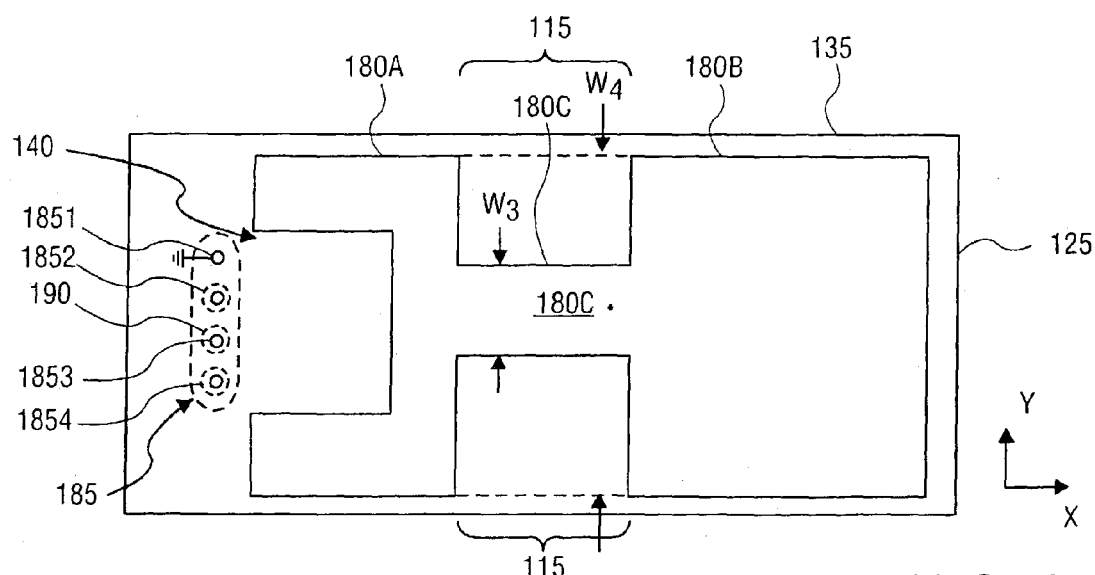
FIG. 3 shows a schematic bottom view of the substrate package of FIG. 1 in an unfolded state.

FIG. 3 shows a second side of substrate 125 including second surface 135. FIG. 3 shows second surface 135 of substrate 125 having a number of contact points accessible on surface 135. In one embodiment, contact points 185 correspond with an area adjacent first contact area 140. In one embodiment, contact points 185 may be connected to a panel, such as a printed circuit board, through solder connections. It is appreciated that although only a few contact points 185 are illustrated, that a number of contact points may extend through substrate 125 and be visible at surface 135 of substrate 125.

FIG. 3 also shows plication portion 115 of substrate 125 corresponding to an area of substrate 125 that accepts the fold. FIG. 3 also shows reference plane 180A as a continuous body on or near surface 135 of a first portion of substrate 125 and reference plane 180B as a continuous layer on or near surface 135 of a second portion of substrate 125. In one embodiment, reference plane 180A and reference plane 180B are in the same plane, possibly formed through a single blanket metal layer. Reference planes 180A and 180B are connected through one or more bridges to form a continuous layer (e.g., a continuous plane) on or near surface 135 of substrate 125. As illustrated, in one embodiment, reference plane 180B extends over an area corresponding to an area from which signal lines may extend between second attachment site 145 and plication portion 115 (corresponding, for example, to an area that signal lines may traverse between chip 110 and chip 120). Reference plane 180A corresponds to an area from which signal lines may extend between first attachment site 140 and plication portion 115. It is appreciated that, in other embodiments, reference plane 180A and reference plane 180B may extend over more area of substrate 125.

In the embodiment shown in FIG. 3, a single bridge, bridge 180C, is shown. Bridge 180C, in this embodiment, has a lateral width, $W_3$, spatially aligned to a lateral width, $W_2$, corresponding to traces 160 in opposite side of substrate 125 (see FIG. 2). A collective reference plane consisting of reference plane 180A, reference plane 180B, and bridge 180C may be brought to ground through connection to one or more contacts on a circuit panel to form a ground plane. In this manner, signals that may be more sensitive to impedance variations may be spatially aligned through traces 160 with a ground plane bridge through plication 115 to control trace impedance variations.

In the above embodiment described with reference specifically to FIG. 2 and FIG. 3, a single bridge between reference plane 180A and reference plane 180B is shown. In this manner, substrate 125 may be folded through plication region 115 more easily than had a reference plane having a lateral width $W_4$ equivalent to the width of reference plane 180A or reference plane 180B as illustrated or a lateral width of substrate 125 been utilized. In making the reference plane bridge set through a central portion of the lateral width of substrate 125, in the embodiment described, signals that might be sensitive to impedance variations for a particular application may be routed through traces spatially aligned with bridge 180C through a center of the lateral width of substrate 125. It is appreciated that the one or more bridge(s) need not be located at the center or approximately the center of the substrate but may be spaced accordingly, perhaps to accommodate a preferred location for trace routing of sensitive signals.

Referring again to FIG. 3, a collective reference plane consisting of reference plane 180A, reference plane 180B, and bridge 180C is shown near or on surface 135 of substrate 125. The collective reference plane may be connected to ground through a panel (e.g., printed circuit board) connection. Representatively, FIG. 3 shows contact point 1851 that may be connected, perhaps through a solder connection to a printed circuit board to bring the collective reference plane to ground through the panel. FIG. 3 also shows contact points 1852, 1853, and 1854 that may be used to carry power or signals between package 125 and a panel. As illustrated, contact points 1852, 1853, and 1854 do not contact reference plane 180A directly but are isolated from reference plane 180A by area 190 (e.g., antipad).

Figure 4:
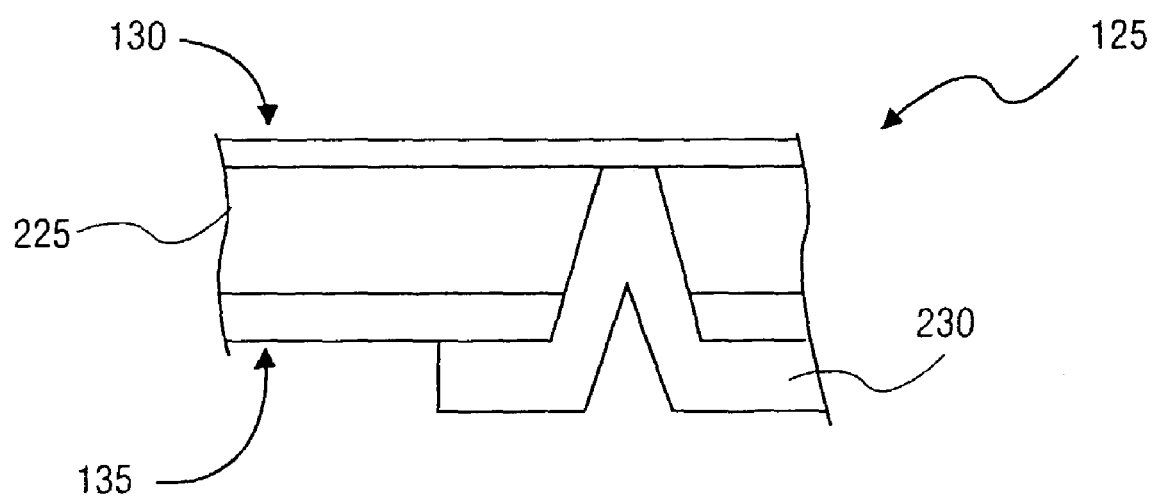
FIG. 4 shows a cross-sectional side view of a portion of the substrate package of FIG. 1.

FIG. 4 shows a cross-sectional side view of a portion of substrate illustrated in FIG. 1 and described in detail with reference to FIG. 2 and FIG. 3 and the accompanying text. Specifically, FIG. 4 shows a portion of substrate 125 having a contact formed through the substrate between surface 130 and surface 135. Representatively, a contact point to ground will be described.

Referring to FIG. 4, substrate 125 includes insulating body 225 of a polyimide material having a thickness on the order of 25 to 50 microns. First surface 130 of substrate 125 includes contact points and reference and signal traces (see, for example, FIG. 2). The contact points and reference and signal traces are formed, for example, from a copper foil bonded to insulating body 225. Representatively, a suitable copper foil is on the order of 12 microns thick. Contact points and traces may be patterned, for example, by masking the copper foil in a desired pattern, etching away unmasked portions of the foil, and removing the mask to reveal the desired contact points and traces.

Referring to FIG. 4, side 135 of substrate 125 may also include copper foil patterned as a collective reference plane as described above. Using the example of FIG. 3, the copper foil will be patterned into reference plane 180A, reference plane 180B and bridge 180C over a plication region. Once the collective reference plane is patterned, contact points to traces on surface 130 of substrate 125 may be formed by drilling contact vias and then electroplating the vias with copper material as a contact structure. FIG. 4 shows contact 230 formed through insulating body 225 to first surface 130. Representatively, contact 230 may have a thickness on side 135 on the order of 15 microns.

Figure 5:
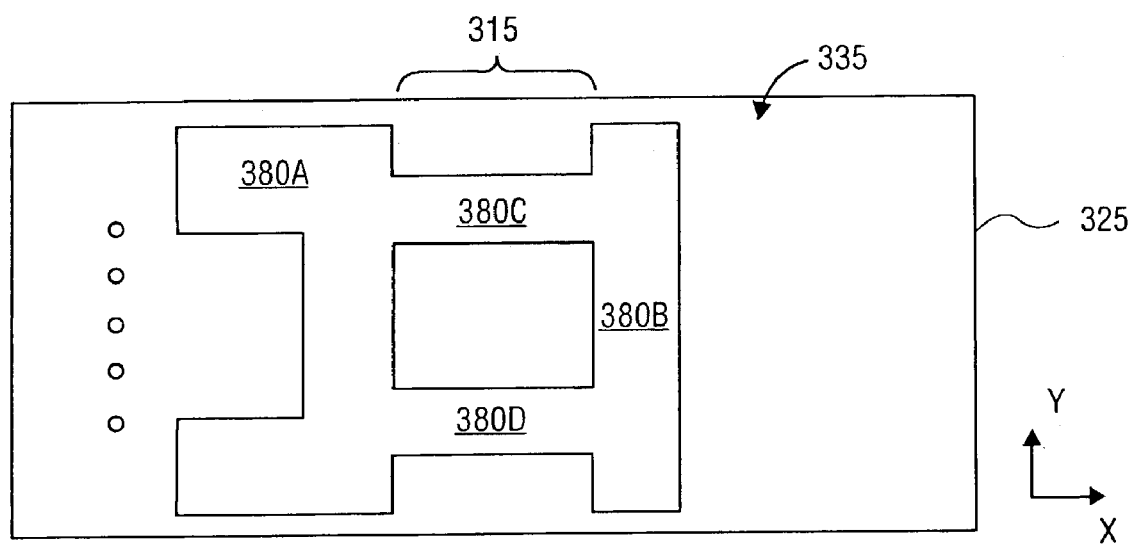
FIG. 5 shows a schematic view of a side of a foldable substrate package according to another embodiment.

FIG. 5 shows another embodiment of a package substrate. Substrate 325 is, for example, a foldable substrate. FIG. 5 shows substrate 325 in an unfolded or generally planar configuration. FIG. 5 shows side 335 corresponding to a ground side of the substrate. Side 335 includes reference plane 380A and reference plane 380B as continuous layers on a first portion and a second portion, respectively, in a plane of substrate 325 (including, for example, on surface 335). Reference plane 380A and reference plane 380B are connected through bridge 380C and bridge 380D. In this embodiment, reference plane 380B extends as a continuous layer between an area corresponding to an attachment site and plication portion 315 (e.g., corresponding to an area that signal lines may traverse between chips on a surface of substrate 325). Similarly, reference plane 380A extends as a continuous layer between an area corresponding to an attachment site and plication portion 315. Bridge 380C and bridge 380D are positioned to be spatially aligned with traces extending through plication region 315 on, for example, an opposite side of substrate 325, particularly traces that may be susceptible to impedance variations for a particular application. Bridge 380C and bridge 380D have a lateral width selected to meet trace spacing for the traces routed on the other side, and to permit folding or plication of substrate 325. Representatively, one or both of bridge 380C and bridge 380D have a lateral width less than a lateral width of bridge 180C described with reference to FIG. 3 and the accompanying text.

Figure 6:
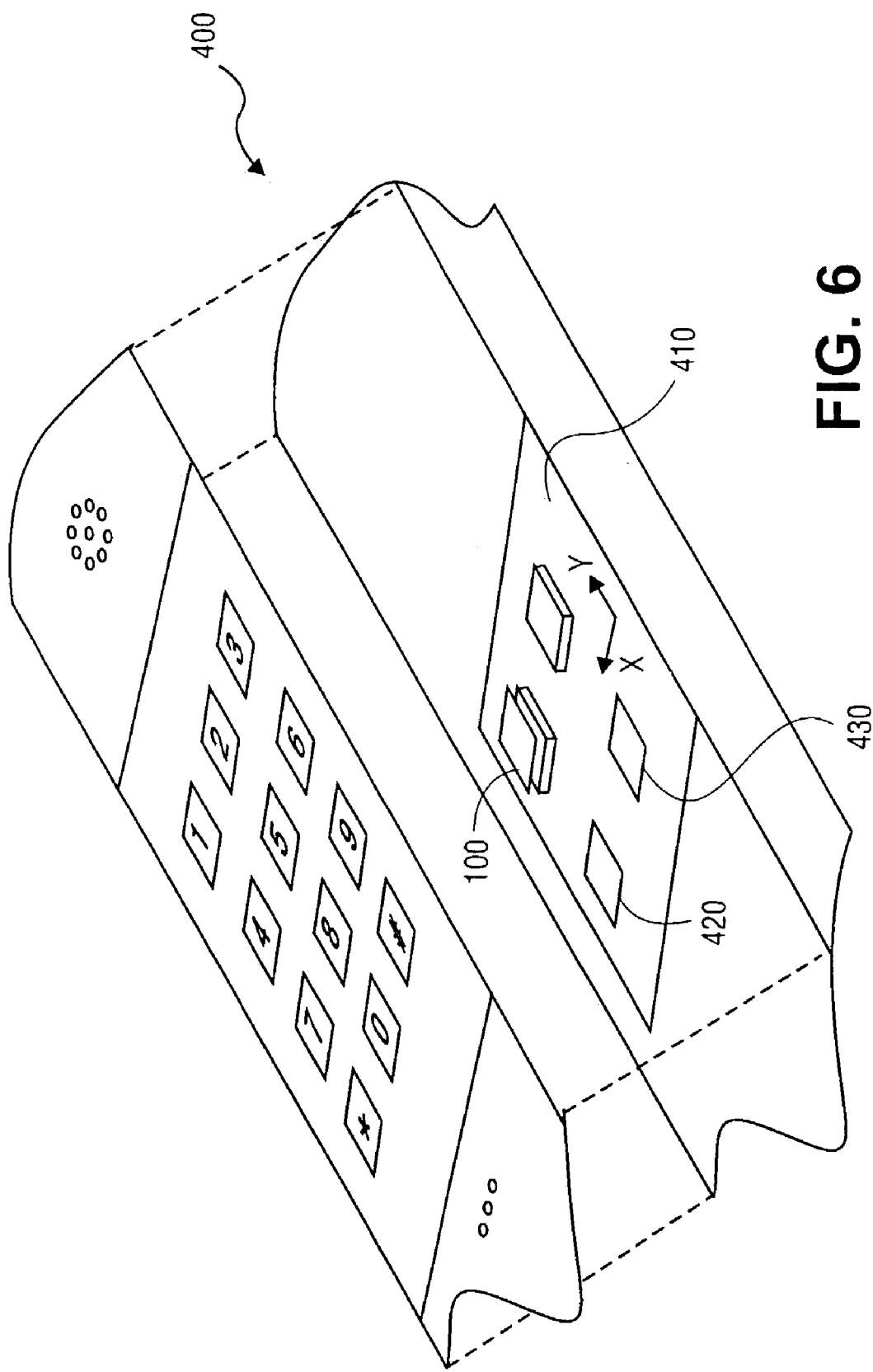
FIG. 6 shows an assembly utilizing a panel including the foldable package of FIG. 1.

FIG. 6 shows an embodiment of an assembly including a panel such as a printed circuit board. Panel 410 of assembly 400 includes an embodiment of package 100 illustrated above. Assembly 400 is representatively a mobile telephone. It is appreciated that a mobile telephone is only one example of a suitable system that might include a microprocessor using a package such as described above, possibly in the context of a multichip module package. Panel 410 also includes other possibly interconnected components that might be necessary, in this instance, for operating a mobile telephone such as a power source 420, memory 430, and other peripheral components. By utilizing a package allowing a superposed chip assembly through foldable packages, the XY dimension of a chip package or multichip package may be reduced.

In the preceding paragraphs, specific embodiments are described. It will, however, be evident that various modifications and changes may be made thereto without departing from the broader spirit and scope of the claims. The specification and drawings are, accordingly, to be regarded in an illustrative rather than a restrictive sense.

What is claimed is:

1. An apparatus comprising:
   a substrate having dimensions suitable as a support circuit for at least one integrated circuit and a thickness sufficient to accommodate at least two distribution planes, the substrate comprising a laterally extending plication region defining a first longitudinal portion and a second longitudinal portion;
   a plurality of conductive traces distributed in a first distribution plane of the substrate and extending transversely through the plication region between the first portion and the second portion;
   a first continuous layer of conductive material in a different second distribution plane of the first portion of the substrate and a second continuous layer of conductive material in the second distribution plane of the second portion of the substrate;
   at least one conductive bridge extending transversely through the plication region in the second distribution plane and coupled to the first continuous layer and to the second continuous layer, the bridge having a lateral width less than a lateral width of the first continuous layer and a lateral width of the second continuous layer, the bridge comprising a lateral width through the plication region spatially aligned in a lateral dimension to an area of the first distribution plane through which less than an entire portion of the plurality of conductive traces traverse the plication region; and
   at least one externally accessible contact point coupled to at least one of the first continuous layer and the second continuous layer.

2. The apparatus of claim 1, wherein the plurality of conductive traces can be classified as ones sensitive to impedance variations and ones insensitive to impedance variations for a particular application and the ones of the less than the entire portion of the plurality of conductive traces comprise ones sensitive to impedance variations.

3. The apparatus of claim 1, comprising a plurality of conductive bridge each comprising a lateral width and laterally spaced from one another and spatially aligned in a lateral dimension to respective areas of the first distribution plane through which respective portions of the plurality of conductive traces transverse the plication region.

4. The apparatus of claim 1, further comprising a plurality of externally accessible contact points on the first portion and coupled to the plurality of conductive traces and configured to route signals between an integrated circuit device on the first portion through respective ones of the plurality of conductive traces.

5. The apparatus of claim 1, wherein the substrate comprises a flexible material.

6. The apparatus of claim 5, wherein the flexible material comprises a polyimide.

7. An apparatus comprising:
   an integrated circuit comprising a plurality of devices and externally accessible signal circuitry; and
   a substrate having dimensions suitable as a support circuit for at least the integrated circuit and a thickness sufficient to accommodate at least two distribution planes, the substrate comprising:
   a laterally extending plication region defining a first longitudinal portion and a second longitudinal portion,
   a plurality of conductive traces distributed in a first distribution plane of the substrate and coupled to the integrated circuit and extending transversely through the plication region between the first longitudinal portion and the second longitudinal portion,
   a first continuous layer of conductive material in a different second distribution plane of the first portion of the substrate and a second continuous layer of conductive material in the second distribution plane of the second portion of the substrate, and at least one conductive bridge having a lateral width less than a lateral width of the first continuous layer and a lateral width of the second continuous layer and extending transversely through the plication region in the second distribution plane and coupled to the first continuous layer and to the second continuous layer, wherein the bridge comprises a lateral width through the plication region spatially aligned in a lateral dimension to an area of the first distribution plane through which less than an entire portion of the plurality of conductive traces traverse the plication region.

8. The apparatus of claim 7, wherein the substrate further comprises at least one externally accessible contact point coupled to at least one of the first continuous layer and the second continuous layer.

9. The apparatus of claim 7, wherein the substrate is coupled to the integrated circuit through a first plurality of externally accessible contact points and the substrate further comprises a second different plurality of externally accessible contact points coupled to the conductive traces.

10. The apparatus of claim 7, wherein the integrated circuit comprises a first integrated circuit coupled to the first portion of the substrate and the apparatus comprises a second integrated circuit coupled to the second portion of the substrate.

11. An apparatus comprising:
a housing;
a printed circuit board coupled to and disposed within the housing;
a package coupled to the printed circuit board, the package comprising an integrated circuit and a substrate, the substrate comprising:
  a first longitudinal portion and a second longitudinal portion defined by a plication in the substrate,
  a plurality of conductive traces distributed in a first distribution plane of the substrate and coupled to the integrated circuit and extending between the first portion and the second portion,
  a first continuous layer of conductive material in a different second distribution plane of the first portion of the substrate and a second continuous layer of conductive material in the second distribution plane of the second portion of the substrate,
  at least one conductive bridge in the second distribution plane extending transversely through the entire plication and coupled to the first continuous layer and to the second continuous layer wherein the bridge comprises a lateral width through the plication region spatially aligned in a lateral dimension to an area of the first distribution plane through which less than an entire portion of the plurality of conductive traces traverse the plication region, and
  a contact point coupled to at least one of the first continuous layer and the second continuous layer and coupled to a reference point of the printed circuit board; and
a memory chip coupled to the printed circuit board.

12. The apparatus of claim 11, wherein the reference point of the printed circuit board is a ground reference point.

13. A method comprising:
forming a substrate having dimensions of a support circuit for at least one integrated circuit, the substrate comprising a laterally extending plication region defining a first longitudinal portion and a second longitudinal portion;
patterning a plurality of conductive traces on a first surface of the substrate, a portion of the plurality of conductive traces extending transversely through the plication region between the first portion and the second portion;
forming a continuous layer of conductive material on a second surface of the substrate opposite the first surface in a second distribution plane of the first portion of the substrate and a second continuous layer of conductive material in the second distribution plane of the second portion of the substrate;
patterning the continuous layer into a first continuous layer portion on the first longitudinal portion of the substrate, a second continuous layer on the second longitudinal portion, and at least one conductive bridge extending transversely through less than the entire plication region and coupled to the first continuous layer and to the second continuous layer; and forming at least one externally accessible contact point to at least one of the first continuous layer and the second continuous layer.

14. The method of claim 13, wherein patterning a plurality of conductive traces comprises patterning ones sensitive to impedance variations and ones insensitive to impedance variations for a particular application and the ones of the plurality of conductive traces that are sensitive to impedance variations are patterned to be spatially aligned with the at least one conductive bridge.

15. The method of claim 13, wherein patterning the continuous layer comprises patterning a plurality of bridges spaced from one another and each extending transversely through less than the entire plication region.

* * * * *